United States Patent

Taylor

[15] 3,659,288

[45] Apr. 25, 1972

[54] ANALOG CONVERTOR AND COMPUTER CIRCUIT PRODUCING OPTIMIZED PULSE OUTPUT

[72] Inventor: Charles F. Taylor, Burlington, Vt.

[73] Assignee: Vermont Technical Groups, Inc., South Burlington, Vt.

[22] Filed: June 23, 1969

[21] Appl. No.: 835,485

[52] U.S. Cl. ....................................340/347 NT, 340/347 AD

[51] Int. Cl. ..........................................................H03k 13/02

[58] Field of Search ....................................340/347, 347 NT

[56] References Cited

UNITED STATES PATENTS

| | | | |
|---|---|---|---|
| 3,500,247 | 3/1970 | Sekimoto | 340/347 |
| 3,447,147 | 5/1969 | Deregnaucourt | 340/347 |
| 3,426,296 | 2/1969 | Christiansen | 340/347 |
| 3,256,426 | 6/1966 | Roth | 340/347 NT |
| 3,267,458 | 8/1966 | Anderson | 340/347 NT |
| 3,305,856 | 2/1967 | Jenkinson | 340/347 NT |
| 3,322,942 | 5/1967 | Gerard | 340/347 NT |
| 3,458,809 | 7/1969 | Dorey | 340/347 NT |
| 3,484,593 | 12/1969 | Schmoock | 340/347 NT |

*Primary Examiner*—Daryl W. Cook
*Assistant Examiner*—Jeremiah Glassman
*Attorney*—Hubbell, Cohen & Stiefel

[57] ABSTRACT

A dual slope analog-to-binary converter employs a flip-flop in a unique way to optimize a pulse train output relative to a quantized time domain. Another flip-flop revises the output waveform to compensate for pulse shape inaccuracies. The circuit is also used as an analog multiplier or divider, particularly in a lung function analyzer.

17 Claims, 10 Drawing Figures

INVENTOR
CHARLES F. TAYLOR
BY Hubbell, Cohen & Stiefel
ATTORNEYS.

INVENTOR
CHARLES F. TAYLOR
BY
Hubbell, Cohen & Stiefel
ATTORNEYS.

INVENTOR
CHARLES F. TAYLOR

BY

Hubbell Cohen & Stiefel

ATTORNEYS.

INVENTOR
CHARLES F. TAYLOR
BY
Hubbell, Cohen & Stiefel
ATTORNEYS.

ANALOG CONVERTOR AND COMPUTER CIRCUIT PRODUCING OPTIMIZED PULSE OUTPUT

BACKGROUND OF THE INVENTION

1. Field of the Invention

This invention relates generally to data handling circuitry, and is particularly concerned with a device having analog-to-digital conversion and analog computation capabilities which are useful in a lung function analyzer and a variety of other applications.

2. Description of the Prior Art

In the design of analog-to-digital converters it is conventional to apply the analog signal to an integrator of the type comprising an amplifier with a capacitive negative feedback path. The circuit is allowed to integrate the signal to a predetermined threshold level, the time required to accomplish this being proportional to the average amplitude of the signal over that time interval. Clocked digital circuitry employs the proportional time interval to gate a pulsed train, so that the number of pulses gated is a digital representation of the analog signal.

The negative feedback capacitor incorporated in such an integrator stage can only be charged to one polarity for a limited time before becoming fully charged. Then the integration operation must be interrupted to discharge the capacitor, creating a blank interval during which one signal is not integrated. In an A/D converter employing such a periodically blanked integrator stage, the blank intervals are interspersed between intervals of successive integration to the predetermined threshold, and the signal is sampled by the converter only during integration intervals, not during blank intervals.

Subsequent improvements in analog-to-digital converters have made limited use of the blank intervals, but have fallen short of full-time signal tracking. Specifically, in the dual slope type of analog-to-digital converter, examples of which are seen in U. S. Pat. Nos. 3,051,939 of Gilbert and 3,316,547 of Ammann, the integrator operates continuously. There are still blank intervals, but during these blank intervals an opposite polarity reference input of greater magnitude than the maximum signal level is applied to the integrator so that the integrator output ramp reverses its slope. When the reverse slope ramp reaches another predetermined threshold level, the reference input is switched off. Then the signal is applied alone to the integrator, causing it to integrate back to the first threshold, after which the reference input is turned back on to start the next cycle. Alternatively, the switching of the reference input in one direction, e.g. on, may depend solely on a clock source, while switching of the reference input in the other direction, e.g. off, may depend solely on the attainment of a predetermined output threshold level.

With prior art circuits of the dual slope type, although the integrating stage may track the analog signal continuously, the A/D conversion output does not. It still is necessary to use one of the ramp slopes to measure time intervals proportional to the analog signal, and gate out streams of pulses during such intervals. Between these pulse gating intervals, however, while the opposite ramp slope is in progress, the circuit conveys no information as to the signal amplitude. Thus there are still blank intervals of no information between discrete information read-out events.

Moreover, an observer must wait till the end of each discrete bunch or stream of pulses which constitutes a read-out event, in order to know what analog signal level is being reported, since it is the size of the entire bunch which conveys information. Consequently, although the average amplitude of the pulse stream output of a prior art converter circuit represents the value of the signal in an analog as well as a digital sense, the length of time over which such a pulse stream must be averaged is as long, and resultantly the size of the RC filters required to perform this averaging function is so great, that, as a practical matter, any subsequent calculations which are performed on the output of such a converter circuit must be done by digital circuitry. It would be desirable for an analog-to-digital converter circuit to produce an output having useful analog and digital significance simultaneously, so that the converter could be used with both analog and digital computing circuitry within the same device, for example a lung function analyzer.

Furthermore, in a lung function analyzer and in other devices as well, one electrically represented quantity must be delayed for a period of time in order to be properly synchronized with another electrically represented quantity with which it is to be employed in a mathematical computation. When the quantity to be delayed is represented by a group of pulses collectively, then the delay required can only be achieved by means of a shift register or other digital storage capable of holding all pulses of the group in parallel. This is not difficult when dealing with coded digital information, but the length of shift register necessary for parallel pulse storage becomes impractically long when the waveform in question comprises a large number of high repetition rate pulses gated out during the long charging interval of the large capacitor.

Another disadvantage of prior art analog-to-digital converters resides in the fact that, in order to achieve adequate signal amplitude resolution, the circuit must integrate the signal over a relatively long time period, which requires a rather large negative feedback capacitance. This has a number of disadvantages, including cost and bulk, and it also prevents an analog-digital converter of this type from being designed as an integrated circuit mounted upon a single chip and incorporated within a single package.

A further disadvantage of prior art circuitry is that the quantization of the time domain which results from pulse bunching is undesirable coarse. If the clock source which controls the digital output of a prior art A/D converter is a 10 KHz oscillator, then the individual output pulses issued by the circuit will have a 10 KHz repetition rate, but will be gated out over a measured time interval proportional to the signal input, which measured time interval is very much larger than the duration of the individual clock pulses. The time duration of the gating interval is a limiting factor in the speed with which such an analog-to-digital converter can respond to changes in the analog signal input, because the circuit cannot respond to a signal change during a gating interval. Moreover, the situation is aggravated by the fact that, for reasons of circuit stability, prior art dual slope converters are required to have pulse gating intervals which are substantially longer than the signal tracking intervals interspersed therewith; a 4 to 1 ratio being typical. As a result, these circuits have quite poor transient response.

There is an entirely different type of prior art analog-to-digital converter, namely a voltage-to-frequency converter, the output frequency of which changes instantaneously in response to changes in signal voltage. However, the output of such a circuit is not clock-synchronized for use in digital circuitry, and it has an average amplitude of zero which is not useable in analog computing circuitry.

SUMMARY OF THE INVENTION

The present invention, like prior art dual slope analog-to-digital converters, alternately switches on a reference input which is summed with and opposes the signal, causing the integrator to integrate down, and then the circuit switches off the reference input to allow the integrator to integrate up. But the invention employs a totally different type of clocked circuitry to switch the reference input on and off in a unique manner which follows an optimizing algorithm. The circuit which accomplishes this does not switch either solely in response to a level nor solely in response to a clock event, but instead switches only upon the occurrence of a set of conditions dependent upon both the integrator output level and clock time.

The nature of this circuit is such that it has optimum transient response (relative to a clock-quantized time domain). The output of the converter responds to signal changes (i.e., converges toward a new signal level) within the very next clock interval after the integral of the signal crosses a threshold level. Thus the response is limited only by clock resolution of the time domain, rather than being limited by a much longer gating interval. As a result, the time resolution permitted by this technique is vastly greater than that of the prior art, because the time quantization of transient response is on the same scale as the basic clock frequency, e.g. 10 KHz in the specific example given, or at worst only one step of frequency division removed, i.e. 5 KHz. We might describe the situation metaphorically by saying that the prior art samples the analog signal on a batch process basis, while the present circuit represents the signal on a continuous, or dynamic, basis, subject only to the limitations imposed by clock resolution.

One consequence of such dynamic signal tracking is that there are no blank intervals during which the signal is thrown away and not included in the analog-to-digital conversion.

An additional consequence is that the average amplitude of the output waveform is a useable analog representation of average signal amplitude, due to the fact that the output quickly converges to signal values, hence the pulse train averaging time, and therefore the component values required for such averaging, are kept within practical bounds. This permits the output of the present analog-to-digital converter circuit to be employed in both digital and analog computations within the same device.

Another consequence is that, with reference to the significance of the pulse train average as an analog representation of the signal, the average amplitude of the pulse output of this circuit over any time period, even over its entire history from a given moment all the way back to the time when the circuit was turned on, converges toward the average signal amplitude over that same time period, even if the signal is not constant over that period; whereas in prior art circuits the average of a particular output pulse bunch is a true analog representation of the average value of a changing signal only over the immediately preceding signal sampling interval. If the signal changes during blank intervals, then the failure to average in such a signal change makes the long term average of the pulse output an erroneous representation of the long term average of the signal.

Moreover, when a pulse train derived from a circuit of this type is used to perform an analog computation, the time delay necessary to synchronize it with another signal can be achieved by the use of a shift register of modest length, due to the fact that a relatively small pulse "window" is sufficient for accurate signal representation.

The output pulse train of the present circuit, unlike the output of a voltage-to-frequency converter, is clock-synchronized and thus is fully compatible with conventional digital circuitry.

The integrator incorporated in the present circuit does not require a long integration time, and thus can be designed with a small feedback capacitor. This in turn allows the entire converter to be manufactured in integrated circuit form, i.e. as a single chip incorporated in a single package.

BRIEF DESCRIPTION OF THE DRAWINGS

In the drawings.

The same reference characters refer to the same elements through the several views of the drawing.

DETAILED DESCRIPTION OF THE PREFERRED EMBODIMENTS

Theory of Operation

Figure 1:
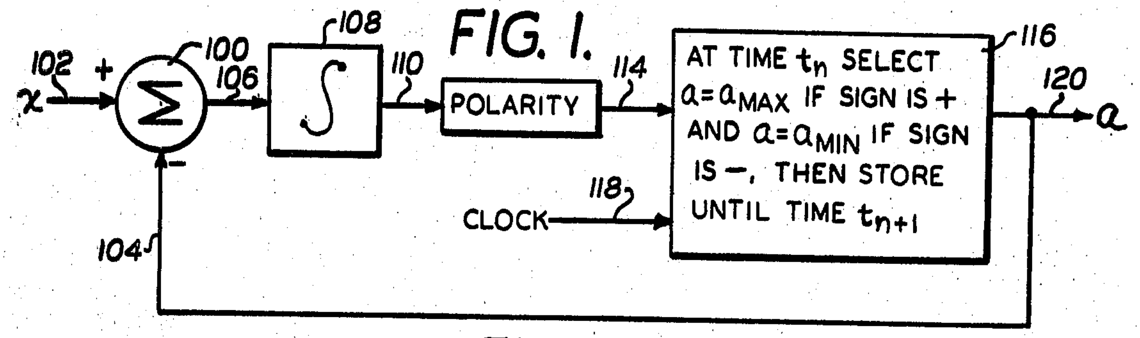
FIG. 1 is a functional block diagram illustrating the basic theory of operation of a circuit in accordance with this invention.

It will be recalled from the preceding discussion that past analog-to-digital converters divide the time domain into periods of time in which the analog input signal is digitally converted, alternately interspersed with periods of time during which the signal is ignored. The output of such a circuit comprises groups of pulses issued at a fixed repetition rate, the number of pulses in each group being proportional to the average value of the analog signal over the duration of the conversion interval. The bunching of pulses, which is due to the fact that they are gated out only during intermittent phases of operation, makes the output discontinuous, in the sense that there is no output at all in the interval between bunches. The output is also characterized by the fact that no individual pulse time, considered apart from its role as a contribution to the "population" of a pulse bunch, constitutes an attempt by the circuit to respond to a signal change.

It would be desirable for the output of an analog-to-digital converter to be continuous in the sense that, although the time domain is quantized by a clock source, at each clock time the circuit evaluates any changes which have occurred in the level of the analog signal since the last clock time, and has the capability of revising its output within one, or at most a few, clock times, to reflect such changes. There should be no waiting between bunches of pulses, and each individual pulse in itself should attempt to converge the output of the converter (as far as possible) toward a true representation of the analog signal input. The only discontinuity in such a system would arise out of the necessity to wait from one clock time to the next; but this is obviously preferable to the much longer wait over a large number of clock times, i.e. a long stream of clock pulses.

This objective, which may be called a "clocked optimal pulse sequence," may be stated in the form of an algorithm for repeatedly converging a binary pulse sequence to an accurate representation of a dynamically varying analog value. To derive the necessary algorithm, let time be quantized into discrete equal intervals delta $t$, in which $t_i$ is the $i^{th}$ clock time, $0<i<$ and $i$ is an integer. Then $t_{i+1}-t_i$=delta $t$. Assume that during any delta $t$, there may be either an output equal to a constant, $a_{max}$, or an output equal to a smaller constant $a_{min}$. In the most general terms, the values $a_{max}$ and $a_{min}$ can have any waveshapes in the interval delta t, so long as they are unique, and have respective average values $a_{max}$ and $a_{min}$ over intervals delta $t$ which are constant from one such interval to another, and satisfy the relationship $$\int a_{\min}dt < \int x dt < \int a_{\max}dt$$

(where all integrals are over the interval delta $t$). In practical terms, however, we may consider $a_{max}$ and $a_{min}$ to be binary logic levels, i.e. high and low voltages, and the wave shape to be a conventional rectangular pulse (or the absence thereof) equivalent respectively to the average values of the waveshapes $a_{max}$ and $a_{min}$. It is now desired to represent a variable analog input signal $x(t)$ by a serial pulse sequence, $a$, of the two-valued symbols $a_i=a_{max}$ or $a_{min}$, such that $a=\{a_0, a_1, a_2, \ldots a_i \ldots a_n\}$, where $a_{min} \leq x(t) \leq a_{max}$. We further wish to represent $x(t)$ by the sequence, $a$, in an optimal sense such that:

$$\int_0^{tn+1} (x-a)dt \qquad \text{Eq. (1)}$$

is a minimum, where $n$ is a variable integer. If such a sequence, $a$, exists, it is the clocked optimal pulse sequence representation of the analog variable $x(t)$ which we are seeking. Equation (1) says that we wish to minimize the integral of the error between the variable $x(t)$ and the pulse sequence, $a$ representing the variable over an arbitrary number of clock times (i.e. a variable averaging time). This may appear to be a formidable task when n becomes large, because of the $2^{n+1}$ possible combinations in the sequence $a=\{a_0, a_1, a_2 \ldots a_n\}$. The fact that $n$ is variable may even appear to imply impossibility, but the problem may be solved utilizing dynamic programming. First, by allowing n to be a variable, we are invoking the principle of invariant imbedding. That is, we imbed the problem of fixed $n$ into a broader class of problems, variable n. Next, the principle of optimality is invoked, and a closed loop feedback policy for generating the optimal sequence results. The principle of optimality states that if we know that an n-stage decision process is optimal, then regardless of what the $n-1$ decisions may have been, the $n^{th}$ decision must have been optimal. In the present context this may be interpreted as follows: first Eq. (1) may be rewritten as $$\int_0^{tn} (x-\hat{a})\,dt \int_{tn}^{tn+1} (x-a_n)\,dt \qquad \text{Eq. (2)}$$

where $\hat{a}=\{a_o, a_1, a_2, \ldots a_i, \ldots a_{n-1}\}$ If the first term of Eq. (2) is positive, since we must now choose $a_n$ so as to make the whole expression as small as possible, then we must choose $a_n = a_{max}$. Conversely, if the first term is negative (or equal to zero), we must choose $a_n = a_{min}$. These choices are the best we can do (i.e., optimal) with respect to $a_n$ in minimizing Eq. (2), independent of what $x(t)$ does in the interval $t_n$ to $t_{n+1}$. The above choice must be true for all $n$, which gives us a value selection policy at time $t_n$ having a closed loop feedback characteristic, for generating the clocked optimal pulse sequence.

An operating sequence according to this policy (or algorithm) is shown graphically in the functional block diagram of FIG. 1. A summing device 100 has a pair of input connections 102 and 104. "Plus" and "minus" signs adjacent the inputs 102 and 104 respectively do not necessarily indicate their actual polarities, but merely indicate that these polarities are opposite. Input 102 represents the dynamic variable $x(t)$, the analog signal. Input 104 represents the series, $a$, which at any given instant is equal to $a_i$ having one or the other of two possible values, $a_{max}$ or $a_{min}$. Each successive quantity $a_i$ represents the attempt of the circuit at successive pulse times to converge to the analog signal $x$. The summing device 100 then extracts the algebraic difference between the two inputs 102 and 104, so that the output 106 thereof represents the instantaneous error between the signal $x$ and the digital pulse sequence a appearing at the input 104.

This error quantity 106 is applied to the input of an integrator 108. Accordingly, the integrator output 110 represents the integral of the error quantity 106 ever since the turn-on time of the circuit. The integral 110 is then applied as an input to a polarity detector 112 which determines whether the integral 110 is currently above or below zero, in order to permit a decision as to whether the next logic level to be applied to the input 104 should be $a_{max}$ or $a_{min}$. The polarity detector output 114 is binary, since it merely indicates whether the quantity 110 is above zero or below.

Device 116 is a clocked, digital decision-making circuit which responds to a regular series of spaced clock inputs 118 by reading the binary input 114 at each clock time and selecting the appropriate level for a binary output 120, which is series a. The selection rule is that if the input 114 indicates integral 110 is positive at a particular time "$t_n$" then the value chosen for the quantity $a$ is $a_{max}$, for example a pulse output having a logic level of "one." On the other hand if the input 114 indicates that the polarity of integral 110 is negative at clock time "$t_n$," the value chosen for quantity $a$ is $a_{min}$, for example a logic level of "zero." In either case the decision-making device 116 then holds the chosen pulse level for the entire clock interval $t_n$ to $t_{n+1}$ on the basis of the new polarity information provided then by the input 114.

As a result, the pulse decision of the device 116 is always in the direction necessary to minimize the all-time integral 110 of the instantaneous error quantity 106. The resulting pulse sequence, a, is returned as a negative feedback (input 104) to the summing device 100 in order to continue the time-quantized computation of the error quantity, and can also be used as a digital pulse sequence compatible with conventional digital circuitry.

Outputs 104 and 120 from the decision-making device 116 represent two different aspects of the same pulse train, $a$. Output 120 may be regarded as a digital pulse train devised according to a special scheme for representing the analog signal $x$. Any analog value to be represented by this pulse train is compressed to an arbitrary analog scale between zero and one, and on this scale a value of, for example, one-tenth is represented by one pulse in 10 clock intervals, a value of one-half by one pulse in every two clock intervals, a value of seven-eights by seven pulses in eight clock intervals, and so on. A pulse sequence such as this always converges to a representation of the analog signal in the smallest number of clock intervals permitted by the value of the analog quantity; i.e. 10 for one-tenth, two for one-half, and so on.

Feedback output 104 on the other hand, although it comprises the same pulse train, has a different significance to the summing device 100. The summing device is concerned only with the analog significance of the feedback 104, not its logic value. It treats each digital "one" input as an analog signal of a particular constant level $a_{max}$ continued for a period of time, and treats each digital "zero" input as an analog signal of a particular constant level $a_{min}$ continued for a period of time. Since the instantaneous net output 106 from the summing device 100 is then integrated over the entire operating time of the device by integrator 108, the effect of the pulse train 104 on the integral output 110 is the same as that of any other input, whether or not it has a pulse shape, so long as it has the same average amplitude over an equal time interval. In other words, the input 104 has only analog significance in its effect upon the integral output 110, as it would have to any other device with similar response characteristics. This illustrates the dual significance of the pulse train a issuing from the decision-making device 116.

Basic Circuit

Figures 2, 4:
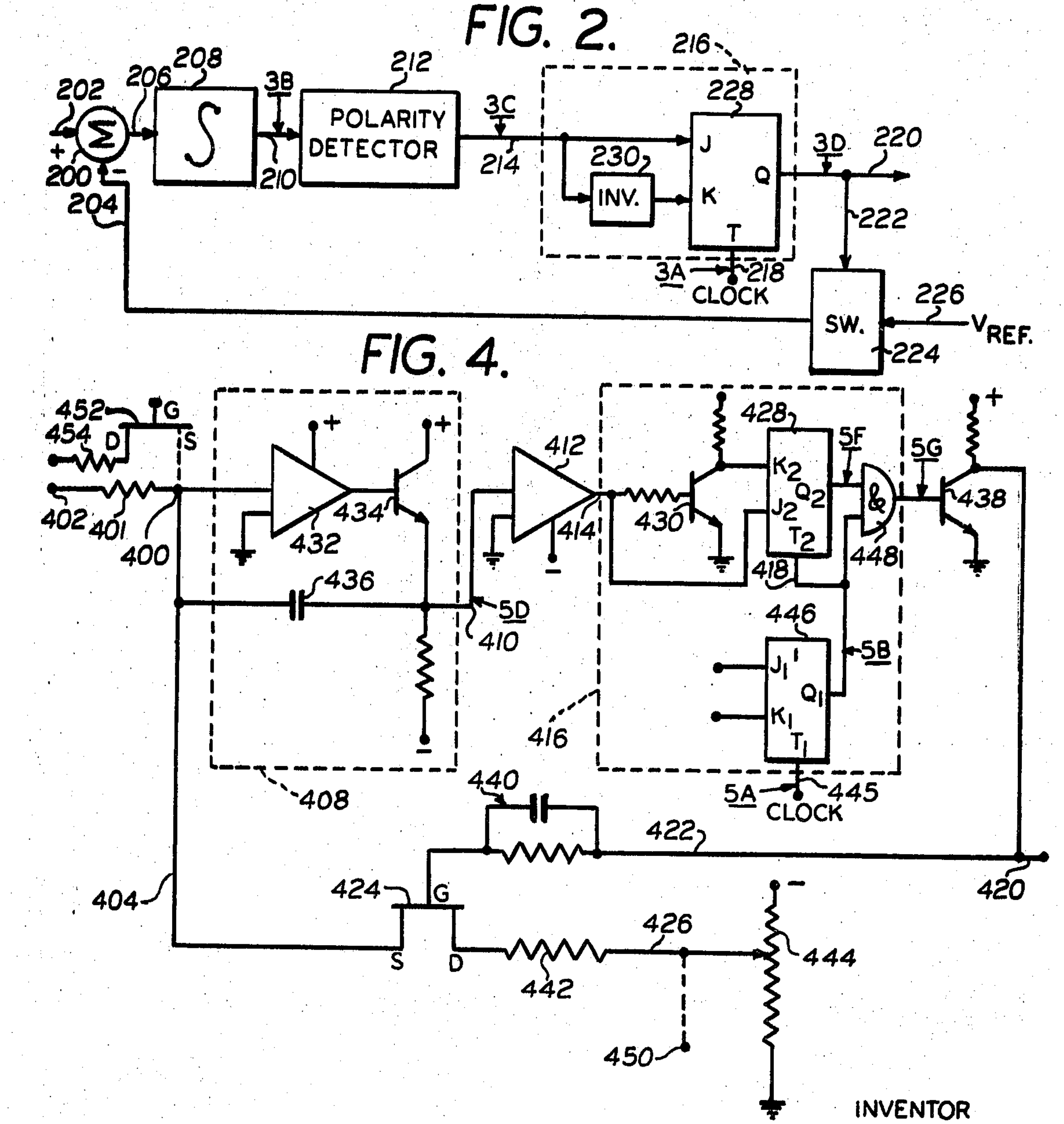
FIG. 2 is a block diagram of one embodiment of a circuit in accordance with the invention.
FIG. 4 is a schematic circuit diagram of a preferred embodiment of the circuit of this invention.

FIG. 2 is a block diagram of a basic circuit for carrying out the functional principle illustrated in FIG. 1. In this circuit the analog signal input is applied to a lead 202, the negative feedback path is represented by a lead 204, and there is a summing device 200 to which leads 202 and 204 are both connected. There is also an integrator circuit 208 of any conventional kind, such as an amplifier with capacitive negative feedback. The integrator output is applied over a lead 210 to the input of a polarity detector circuit 212. The digital output which indicates whether the sign of the integral is positive or negative is applied over a lead 214 to a decision-making circuit 216. The output of this circuit appears on a lead 220, and also appears on a lead 222 which controls a switch 224 for gating a reference voltage applied to a lead 226.

Whenever a logical "one" pulse output appears on the lead 222, the switch 224 is turned on to gate the reference voltage through to lead 204 and the summing device 200. Whenever a logical "zero," the absence of a pulse, occurs on the lead 222, the switch 224 is turned off and the reference voltage is not gated through. The reference voltage applied to the lead 226 and the analog signal applied to the lead 202 are opposite in polarity, as indicated by plus and minus signs, and the reference voltage is large enough to overcome the signal. Accordingly, the integrator 208 integrates up during "zero" pulse intervals when the reference voltage is not applied to the summing junction, and integrates down during "one" pulse intervals when the reference voltage is applied to the summing device. In this circuit, "$a_{max}$" has been arbitrarily set equal to $V_{REF}$ and "$a_{min}$" equal to zero volts.

The decision-making circuit 216 includes a circuit 228 and an inverter 230. The circuit 228 may be of any device having the special property that it switches only upon receipt of a clock input to a toggle terminal designated T, and that, after switching, its output at a terminal designated Q is a particular binary value whenever the input to the terminal designated J was "zero" and the input to the terminal designated K was "one" at the last previous clock time. Conversely, the Q output is an opposite binary value when the J and K inputs at the last previous clock time were the opposite of the described situation.

There is currently on the market a particular type of clockable flip-flop which meets the requirements of this application, namely the conventional JK flip-flop. This device has so-called J and K inputs plus a T or toggle input to which clock pulses can be applied for time quantization of the decision-making process. The truth table for the Q output of such a circuit is given below:

| Just before switching | | Just after switching, output |
|---|---|---|
| J | K | |
| 0 | 1 | Q |
| 1 | 0 | Q |
| 1 | 1 | $X_n$ |
| 0 | 0 | $X_n$ |

It will be appreciated that the upper half of this truth table meets the present requirement, and restriction to the upper half can be achieved if the J and K inputs are tied together in a complemental sense so that one is always logically opposite to the other. JK flip-flops of this type are readily available off the shelf, often in integrated or dual integrated form, and it is a simple matter to connect the J and K terminals of such a circuit to complemental signals by means of inverter 230.

In circuit 216 the binary output of the polarity detector 212 is applied directly to the J flip-flop input terminal and to the input of the inverter 230. Accordingly, the output of the inverter represents the complement of the output of polarity detector 212, and is applied to the K flip-flop input terminal. Consequently, the J and K inputs are not independent, but both depend upon the sign of the integral output signal on the lead 210 as determined by the circuit 212. Accordingly, upon the receipt of each clock input to the T terminal, the flip-flop 228 will provide a particular one of its two logic levels at the Q output in response to a positive integrator output, and the opposite logic level at the Q output in response to a negative integrator output.

The clock input to the T terminal causes the flip-flop 228 to make its decision as to the next logic level output only upon the occurrence of time-partitioning clock events, and then to hold that logic level at least until the next clock event. Since the choice between the two Q output logic levels is determined by the polarity of the integrator output at each clock time, the circuit 216 of FIG. 2 is a physical realization of decision-making device 116 in FIG. 1.

Figure 7:
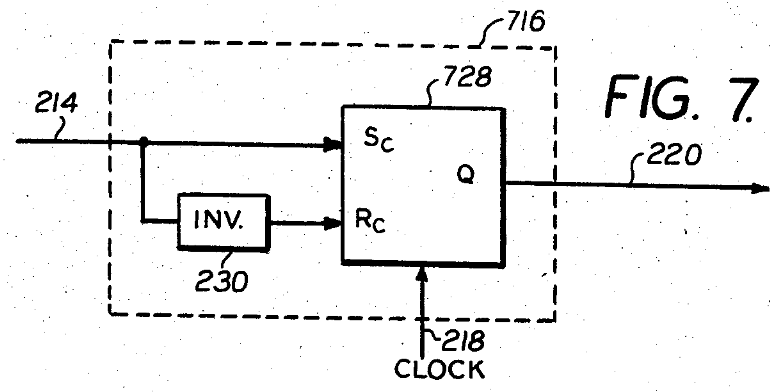
FIG. 7 is a block diagram of an alternative embodiment of a portion of the circuit of FIG. 2; , such that $a = a_0, a_1, a_2,$ .

A variety of alternative physical realizations of the decision-making device 116 are possible. For example, in circuit 216 one might replace the JK flip-flop 228 with a conventional RST flip-flop 728 of the kind used in an alternative decision-making circuit 716 illustrated in FIG. 7. The truth table for this type of binary device 728, for complemental $S_c$ and $R_c$ inputs, is given below:

| $S_c$ | $R_c$ | Q |
|---|---|---|
| 0 | 1 | 0 |
| 1 | 0 | 1 |

When input $S_c$ is a "one" and input $R_c$ is equal to a "zero" at clock time, the Q output becomes "one." The opposite input condition at clock time causes the Q output to become "-zero." Thus the RST binary operates the same way as the JK device 228, for present purposes.

Figure 8:
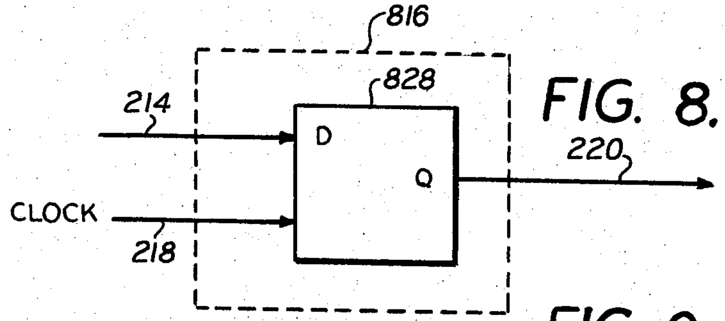
FIG. 8 is a block diagram of another alternative embodiment of the same portion of the circuit of FIG. 2.

Another alternative is the D-latch flip-flop 828 used in the decision-making circuit 816 illustrated in FIG. 8. The D-latch device has only one logic level input (terminal D), and thus eliminates the need for inverter 230 entirely. The D-latch truth table is simply this: if D equals one at clock time, Q becomes one; and if D equals zero at clock time, Q becomes zero. Thus the device operates in the same way as JK circuit 228, without any need for complemental tying of inputs.

Figure 9:
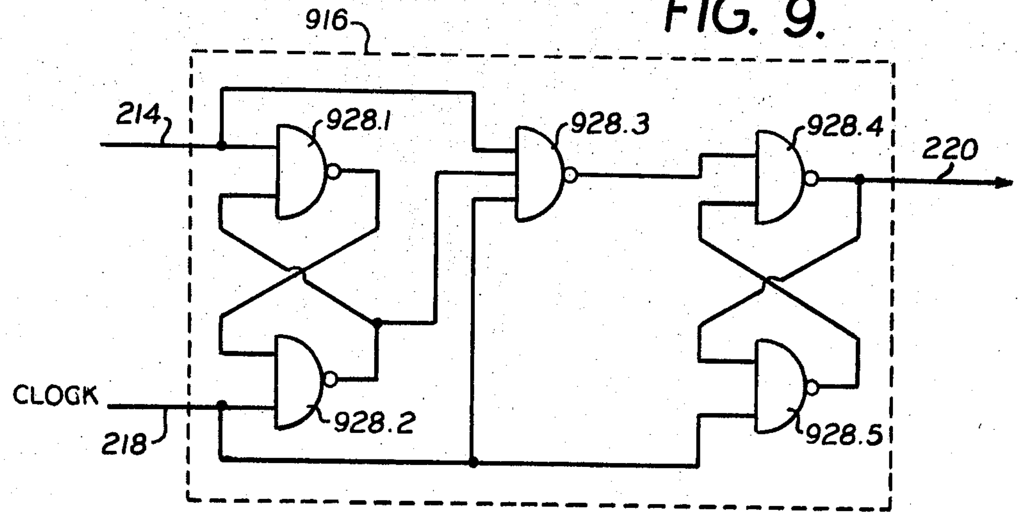
FIG. 9 is a block diagram of still another alternative embodiment of that same portion of the circuit of FIG. 2.
Figure 10:
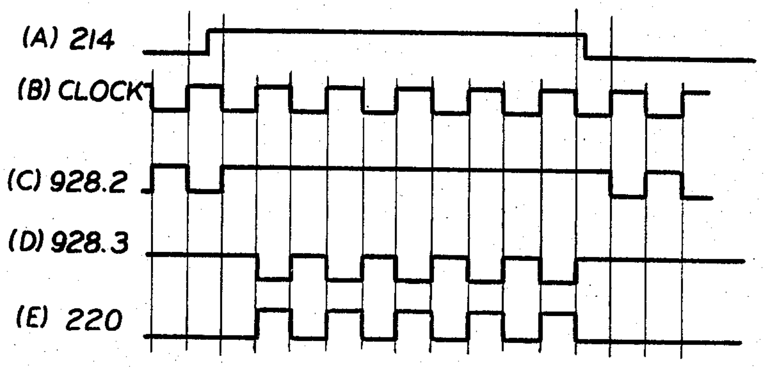
FIG. 10 is a diagram of the waveforms associated with the operation of the circuit illustrated in FIG. 9.

Nor is it necessary to employ a flip-flop at all. Any switching circuit which satisfies the truth table requirement will do. For example, in FIG. 9 there is seen an alternative decision-making circuit 916 employing only nand gates 928.1 through 928.5 to convert the polarity and clock event inputs into a feedback switching output. As shown by the waveform diagram of FIG. 10, the output of circuit 916 will rise when the two inputs are both high, provided the polarity information input on lead 214 goes high first. The output falls again when either input falls, and remains low when the stated sequence of rising inputs is not observed. The same results could be achieved by employing nor gates, as will now be evident to a skilled logic designer.

Figures 3, 6:
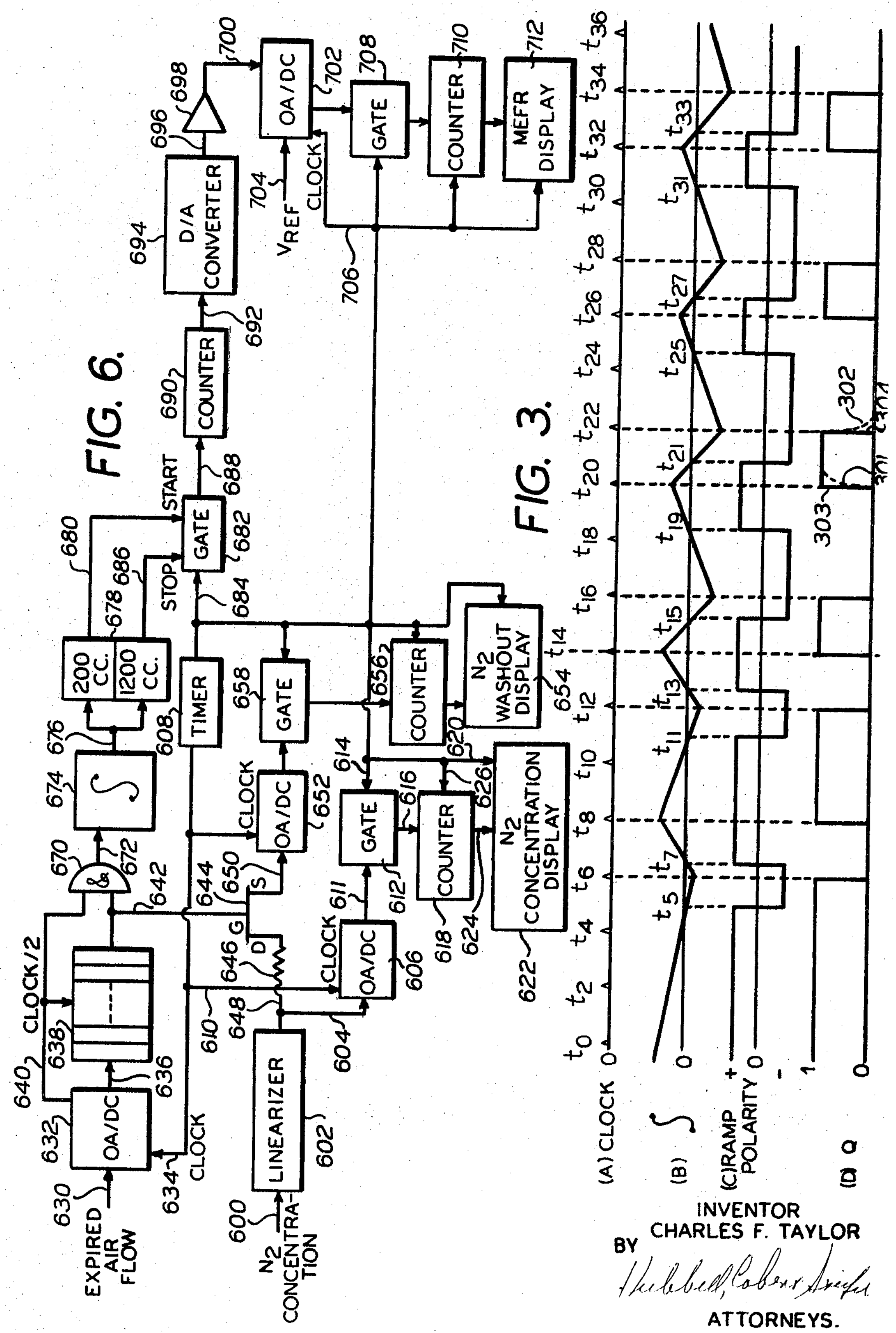
FIG. 3 shows the waveforms of voltage versus time at various points in the circuit of FIG. 2.
FIG. 6 is a block diagram of a portion of a medical lung function analyzer employing circuits in accordance with this invention.

The detailed operation of the circuit of FIG. 2 is illustrated by the waveform diagrams of FIG. 3. Waveform 3A appearing at the designated place in the circuit of FIG. 2 constitutes the clock input, a spaced series of positive voltage spikes occurring at fixed time intervals. Waveform 3B appearing at the place designated in FIG. 2 represents the dual slope ramp output of the integrator 212, which changes its slope direction whenever the feedback reference voltage 226 is passed through the lead 204 or cut off by the switch 224. Waveform 3C appearing at the indicated place in FIG. 2 is the binary output of the polarity detector 212 which indicates at any given instant whether the integrator output ramp (waveform 3B) is above or below zero. Waveform 3D appearing at the designated place of the circuit of FIG. 2 is the binary output at terminal Q of the JK flip-flop 228, and it could also represent the switching on and off of the reference voltage to the feedback lead 204.

Arbitrarily designating some clock time as $t_o$, and assuming a given polarity and amplitude of the integrator output ramp (3B) at time $t_o$, the sequence of operation of the circuit of FIG. 2 can now be traced. Let us assume that a relatively high analog signal is applied to the lead 202 between time $t_o$ and time $t_{14}$. For the sake of simplicity, we may ignore the question of whether there are an odd or even number of polarity reversals throughout the feedback loop of the circuit of FIG. 2 and simply assume that negative feedback is applied to lead 204, causing the integrator output ramp (3B) to slope down when the flip-flop Q output is "one," and that feedback is cut off, allowing the ramp (3B) to slope up when the flip-flop Q output is zero.

From time $t_o$ to time $t_4$ the integrator output ramp (3B) slopes down toward, but does not cross, the zero axis. Accordingly, the polarity detection signal (3C) from circuit 212 remains above zero and the toggle inputs occurring at clock times $t_o$ and $t_2$ are not effective to switch the flip-flop Q output (3D), which therefore remains in the "one" state. But at a non-clock time $t_5$, occurring between clock times $t_4$ and $t_6$, the integrator output ramp (3B) slopes across the zero axis into the negative area, and the ramp polarity indicator voltage (3C) goes negative.

Note that the JK flip-flop 228, by virtue of its clocked switching characteristics, does not immediately change state, in contrast to prior art devices in which the attainment of a particular voltage threshold by the integrator ramp output was in itself a sufficient flip-flop switching condition. On the contrary, the flip-flop 228 of this circuit remains in its present condition for at least an entire clock interval, in this instance remaining in the "one" state at least from clock time $t_4$ to clock time $t_6$, despite the zero-crossing of the integrator output ramp at time $t_5$.

But at clock time $t_6$, when the next clock input reaches the toggle terminal T, the fact that the integrator output ramp (3B) is now below zero causes the flip-flop 228 to change state so that the Q output thereof (3D) goes to "zero" and remains there at least for the duration of the clock interval $t_6$ to $t_8$. During that time therefore, the feedback reference voltage from lead 226 is gated through the closed switch 224 and applied over the feedback lead 204 to summing junction 200, causing the integrator ramp (3B) to reverse its slope.

Since we are presently assuming a high level of analog signal applied to the lead 202, the integrator output ramp (3B) will now integrate upwardly at a relatively steep slope at least from clock time $t_6$ to clock time $t_8$. In doing so, it again crosses the zero axis at non-clock time $t_7$ and reverses the polarity indication signal (3C). But again, this has no immediate effect on the JK flip-flop 228, and the Q output (3D) therefore remains in the "zero" condition. At the following clock time $t_8$,however, the previous zero crossing has its effect on receipt of the next clock pulse, and the JK flip-flop 228 switches, bringing the Q output (3D) to the "one " condition again.

This again turns on the feedback reference voltage, causing the integrator ramp (3C) to slope downwardly again. The downward slope is relatively gentle, since the fixed reference voltage takes a long time to integrate down when matched against a strong input signal. As a result, the next zero crossing is postponed until non-clock time $t_{11}$, after the clock interval $t_8$ to $t_{10}$. As a result the flip-flop output (3D) stays up until clock time $t_{12}$, and then switches due to the zero crossing at time $t_{11}$. The events in the clock interval $t_{12}$ to $t_{14}$ substantially duplicate those in the clock interval $t_6$ to $t_8$, as a result of the zero crossing which occurs at time $t_{13}$ during the course of that clock interval.

It will now be realized that not only does the JK flip-flop 228 not switch solely in response to a zero crossing of the ramp output voltage (3B), but as seen for example at clock times $t_2$ and $t_4$, etc., it also does not switch solely in response to a clock input. It is only the combination of a logic reversal at the J and K terminals followed by a clock input at the T terminal which switches the flip-flop 228. Thus, the flip-flop 228 realizes the algorithmic requirement by switching at the first clock time following the occurrence of a zero crossing.

Because of this switching characteristic, it will be appreciated that the JK flip-flop 228 skips some of its clocked opportunities to switch to a low level, such as $t_2$, etc., switching to "zero" only at the remaining opportunities such as $t_6$, etc. As a result, in the high signal time interval $t_0$ to $t_{14}$ the Q output waveform (3D) is mostly on and only occasionally off. This is how the Q pulse train output digitally represents a relatively high analog input quantity applied to the lead 202.

In contrast, the Q flip-flop output (3D) is mostly low, and only infrequently high, during the time interval $t_{14}$ to $t_{36}$ during which it is assumed that the analog signal on the lead 202 is lower. This results from the same switching characteristic of the JK flip-flop 228, since under low signal conditions the integrator output ramp (3B) takes a long time, for example $t_{16}$ to $t_{19}$, to integrate up to the zero axis, and a relatively short time, for example $t_{20}$ to $t_{21}$, to integrate down to the zero axis. Hence, the flip-flop 228 misses a significant number of clocked opportunities, for example $t_{18}$, to switch the Q output (3D) to a high level, taking only the remaining opportunities to do so, such as $t_{20}$. The result is the output pulse train (3D) in the interval from $t_{14}$ to $t_{36}$, which comprises a relatively small number of "ones" in comparison to a larger number of "-zeros."

In this way, the pulse train output waveform (3D) represents the all-time running average level of the analog input quantity, as normalized to an arbitrary analog scale from zero to one. It generates a high level at the Q terminal during seven out of eight successive clock intervals for a signal corresponding to ⅞ on the arbitrary scale, a high output at the Q terminal for only three clock intervals out of seven for a signal corresponding to 3/7 on the arbitrary scale, and so on. This digital pulse train thus converges to the desired value within the minimum number of clock intervals permitted by the analog signal, since it takes only eight clock intervals to converge to ⅞, seven clock intervals to converge to 3/7, and so on.

It will also be appreciated that the output of this circuit responds instantaneously, within the limits of time-quantization, to any change in the analog signal. For example if at any moment the output pulse train is describing seven "ones" out of eight clock intervals to represent an analog signal corresponding to an arbitrary scale value of ⅞, and during those eight clock intervals the signal abruptly changes to a scale value of 3/7, at the first clock time after the signal change results in a zero crossing at the integrator output, the pulse train abruptly abandons the seven out of eight pattern and starts a new sequence of three out of seven.

By the end of the first seven complete clock intervals following the integrator output zero crossing, the pulse train will have completed its convergence to the new signal value representation. Thus, the speed of response of the circuit to signal changes is limited only by the integrator output amplitude and the basic clock repetition rate time quantization, which in a typical embodiment is of the order of 10 KHz. This is in contrast to prior art circuits, which could only respond at the end of a gating interval long enough to pass a long stream of clock pulses at the basic clock repetition rate. Consequently, for the same basic clock frequency, the prior art circuit is orders of magnitude slower in its transient response. Furthermore, the integrator output amplitude never becomes large enough to constitute a severe limitation on response time, since the negative feedback loop is always forcing it to zero within a small number of 10 KHz clock intervals.

Preferred Circuit Embodiment

FIG. 4 shows the preferred embodiment of the present circuit. An integrator circuit 408 includes a conventional operational amplifier 432 driving an emitter follower buffering stage 434, with a capacitor 436 providing an overall negative feedback loop from the emitter to a current summing junction 400. The polarity detector is in this instance an operational amplifier 412 operating in the saturating mode, so that it is driven to positive saturation by a positive integrator output on the lead 410 and to negative saturation by a negative integrator output on that lead. A decision-making circuit 416 includes an inverter formed by a transistor switching stage 430 which provides the complemental relationship between the J2 and K2 inputs to a JK flip-flop 428 which corresponds to the flip-flop 228 of FIG. 2. The output of the over-all decision-making circuit 416 is reversed in phase by another transistor switching stage 438, which provides a digital pulse train output on a lead 420.

A switching lead 422 drives the gate of a field effect transistor switch 424. An RC differentiating network 440 serves to speed up the gate response. The reference voltage is supplied by a lead 426 which is connected through a current summing resistor 422 to the FET drain. The level of the feedback voltage is adjustable by means of a potentiometer 444 connected between a negative supply and ground. When the FET switch 424 is on, negative feedback is applied over a FET source output lead 404 to the summing junction 400.

During normal analog-to-pulse conversion operation, an analog signal input is applied to an input terminal 402 and is converted by a resistor 401 to a current which is applied to the summing junction 400. The instantaneous net of this analog signal input current and the feedback current which appears intermittently on the lead 404 is integrated by the circuit 408 to produce a dual slope ramp output voltage on the lead 410. This in turn drives the saturating amplifier 412 to produce a binary output on lead 414 indicating the instantaneous polarity of the integrator ramp output. The operational amplifier circuit 412 could be made to detect the relationship of the voltage on lead 410 to any other desired threshold level, but then that level could arbitrarily be regarded as zero, so that we may speak of the "polarity" of the ramp voltage relative to the threshold. The operational amplifier output voltage on lead 414 drives the J2 input of the JK flip-flop 428, and also drives the inverting state 430 to apply a complemental input to the K2 terminal thereof.

In the embodiment of FIG. 4 the toggle input to terminal T2 of the JK flip-flop 428 arrives over lead 418 and is derived in a somewhat different way from the signal on the corresponding lead 218 of FIG. 2, with the result that the decision-making circuit 416 is an improvement over the circuit 216 previously discussed.

The difficulty experienced with the circuit of FIG. 2 stems from the fact that every real pulse employs only an approximation of the ideal vertical leading and trailing edges 303 and 304 illustrated in FIG. 3D. Actually, these leading and trailing edges are the ascending and descending capacitor charging and discharging waveforms 301 and 302 respectively. Note that the actual pulse edges 301 and 302 rise to their effective voltage levels at a somewhat later time than the idealized vertical pulse edges 303 and 304. Moreover, the delay in rising to an effective voltage level, represented by the difference between the real and idealized leading pulse edges 301 and 303 respectively, is greater than the delay in dropping from an effective voltage level, represented by the difference between the real and idealized trailing pulse edges 302 and 304 respectively. Nor is the loss of pulse area at the upper lefthand corner of the pulse necessarily compensated exactly by the gain of pulse area at the lower righthand corner (see the pulse which appears between clock times $t_{20}$ and $t_{22}$ of FIG. 3). One of the advantages of the present invention depends upon the analog significance of the area of the output pulse train. It would thus be desirable to eliminate completely any inaccuracies resulting from imperfect pulse waveform.

This the circuit of FIG. 4 accomplishes in the following manner. With reference to the waveform diagrams of FIG. 5, the basic clock input, for example 10 KHz as in the previous example, is represented by waveform 5A which is applied as indicated in FIG. 4 to a lead 444 connected to the toggle input T1 of another JK flip-flop 446 included within the decision-making circuit 416. The J1 and K1 inputs of this latter flip-flop are unconnected in this circuit which, in the case of at least one commercially available JK flip-flop, is logically equivalent to two identical J and K inputs, for example a "one" input to both the J1 and K1 terminals.

As a result, the flip-flop 446 is operating on the lower half of the truth table set out above. What this table means is that if the Q1 output had any binary value X just prior to the receipt of a toggle input at terminal T1, it would reverse to X just after the receipt of the toggle input. Therefore a clock input (5A) arriving over lead 445 at the flip-flop terminal T1 causes the flip-flop 446 to cycle back and forth so that the Q1 output simply reverses from "one" to "zero" and back again in alternate clock intervals. To state the matter in another way, the flip-flop 446 divides the clock frequency (5A) by two, with the alternating Q1 pulse output segregating alternating clock intervals in such a way that every alternate clock interval coincides with Q1 equal to "one" and the intervening clock intervals coincide with Q1 equal to "zero."

Waveform 5C does not appear anywhere in the circuit of FIG. 4 but it represents the effective "clock-over-two" input seen by the toggle terminal T2 of JK flip-flop 428. This is because the characteristics of such a flip-flop cause it to respond only to positive-going voltage transitions. Thus, the flip-flop 428 responds only to the positive-going voltage transitions of waveform 5B, which occur at alternate clock times $t_2$, $t_6$, $t_{10}$, etc.

Thus, the effective input to terminal T2 is the clock (5A) divided by two. It follows that switching opportunities for the flip-flop 428 occur half as frequently as those of the flip-flop 228 in FIG. 2, and each pulse appearing at the output terminal Q2 must last at least twice as long as the minimum output pulse duration for flip-flop 228. This is clearly seen in the pulse train of FIG. 5F, where the minimum pulse length is two clock intervals of waveform 5A, as for example the interval between clock times $t_{34}$ and $t_{38}$. However, the pulse duration can be longer, specifically a multiple of the minimum pulse time, as for example the pulse in waveform 5F which lasts from clock time $t_{10}$ to clock time $t_{22}$.

In order to avoid problems caused by the actual shapes of the leading and trailing edges of the pulses in waveform 5F, these pulses, which invariably last more than one clock interval, are AND'ed with the pulses in waveform 5B, which never last more than one clock interval, at the input to a coincidence gate 448. As a result, waveform 5G, the output of gate 448, is the logical function Q1 & Q2 , the coincidence of waveforms 5B and 5F. This output (5G) thus depicts the duration of each pulse in waveform 5F by the number of smaller pulses of waveform 5B which coincide with it. In this way the waveform 5F is translated into a number of smaller pulses (5G) each having a fixed time duration, their quantity per unit time digitally representing the analog signal on terminal 402. Also, the average amplitude of waveform 5F is represented by the average amplitude of waveform 5B over the same time interval, thus preserving both the analog and digital significance of waveform 5F in the translation to waveform 5G.

For the purpose of applying negative feedback over the lead 404 to the summing junction 400, potentiometer 444 is used to adjust the reference voltage level on lead 426 which passes through the FET switch 424. This adjustment secures the desired scale relationship between the pulse amplitude in the switch-controlling voltage on lead 422 and the actual feedback amplitude applied to the function 400, and it also solves the problem of pulse shape. Any discrepancy in the amplitude or average value of the output pulses is compensated by the potentiometer adjustment, after which both the analog and the digital significance of the pulse train depend only upon the quantity of pulses per unit time.

Figure 5:
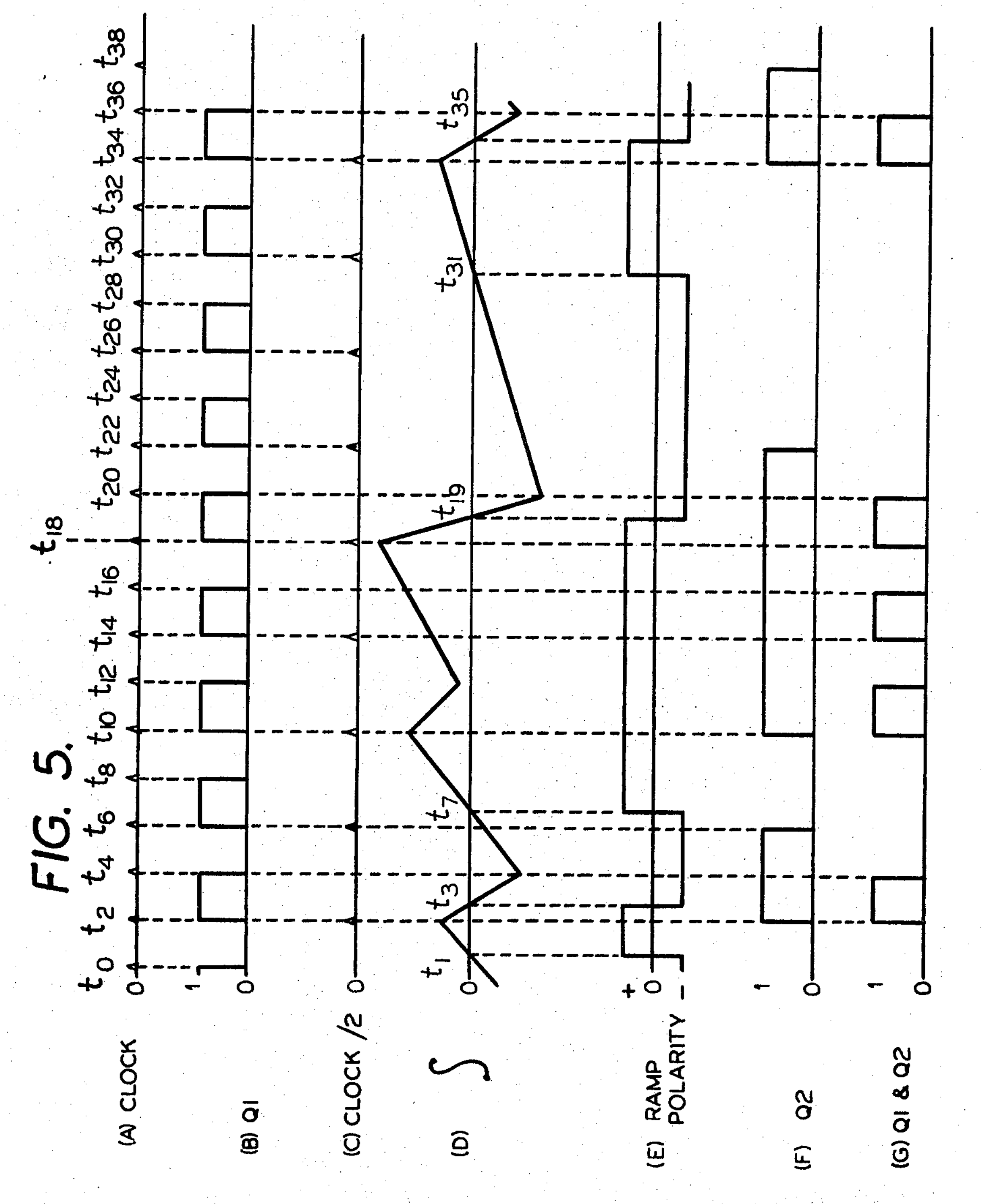
FIG. 5 shows the waveforms of voltage versus time at various points in the circuit of FIG. 4.

In analyzing the waveforms of FIG. 5, it is assumed that the analog signal applied via terminal 402 and current summing resistor 401 is relatively high between a clock time arbitrarily designated $t_o$ and clock time $t_{18}$. It is also arbitrarily assumed that just prior to time $t_o$ the integrator output ramp (5D) is negative but sloping up toward the zero axis, and that the Q1 output (5B) is high while the Q2 output (5F) is low. As a result, the coincidence gate output waveform 5G is low prior to time $t_o$ because of the absence of a Q2 pulse, and is low immediately after time $t_o$ because of the absence of both Q1 and Q2 pulses.

The upward sloping integrator output ramp (waveform 5D) crosses the zero axis into the positive region at a non-clock time $t_1$ between clock times $t_o$ and $t_2$. Accordingly, upon the occurrence of the next switching input putse (clock divided by two, appearing in waveform 5C) the flip-flop 428 switches, the Q2 output (5F) going high and remaining that way at least until the next switching input (5C) occurring at clock time $t_6$. Between clock times $t_2$ and $t_4$ a Q1 output pulse occurs (waveform 5B) and coincides with the initial portion of a Q2 pulse (waveform 5F) to produce a pulse between clock times $t_2$ and $t_4$ in the coincidence gate output waveform 5G.

During this interval, the coincidence gate output drives the inverter stage 438, which turns on the FET switch 424 to apply negative feedback over lead 404 to the summing junction 400. Consequently, from clock time $t_2$ to clock time $t_4$ the integrator output ramp (5D) slopes downwardly, crossing the zero axis at non-clock time $t_3$. The downward ramp slope terminates at clock time $t_4$, however, upon the termination of the switching pulse in waveform 5G, which in turn is caused by the termination of the corresponding pulse in waveform 5B.

Consequently at clock time $t_4$ the integrator output ramp (5D) begins to slope up again, crossing the zero axis once again and entering the positive region at non-clock time $t_7$ between clock times $t_6$ and $t_8$. This zero crossing causes the flip-flop 428 to switch again when the next clock/2 pulse appears in waveform 5C at clock time $t_{10}$. As a result, waveform Q2 goes high again and coincides with a Q1 pulse (5B) from clock time $t_{10}$ to clock time $t_{12}$, so that there is another pulse output from the coincidence gate 448 as seen in waveform 5G.

During this interval the integrator output ramp 5D again integrates down, but this time does not reach the zero axis by the end of the downward slope interval at clock time $t_{12}$. Accordingly, the Q2 output (5F) remains high until the next switching opportunity which is offered by a clock/2 pulse occurring at clock time $t_{22}$ (waveform 5C) following the next zero crossing at time $t_{19}$.

It will now be appreciated that the high signal interval just described, from time $t_0$ to $t_{18}$, produces an output pulse train (5G) which is characterized by a relatively large number of output pulses for the number of clock intervals available. Thus once again, a high analog signal input on lead 402 is represented by a relatively high time density of output pulses, and the average level of that pulse train over the same time interval is an analog representation of the same signal.

In contrast to this, from clock time $t_{18}$ onward, when the analog signal input on terminal 402 is assumed to be relatively low, the time density of pulses in the output pulse train (5G) is seen to be relatively low. This is due to the fact that the integrator output ramp (5D) integrates downward more rapidly, as in the intervals between clock times $t_{18}$ and $t_{20}$ and clock times $t_{34}$ and $t_{36}$, when the negative feedback is matched against a relatively weak signal, and takes a longer time to integrate back upwardly, as between clock times $t_{20}$ and $t_{34}$, thus delaying the switching of flip-flop 428 and skipping a number of opportunities to include Q1 pulses (5B) in the output waveform "Q1 & Q2". This latter part of the waveform represents the low analog signal digitally by a low time density of pulses, and also does so in an analog manner by virtue of its lower average amplitude over the time interval from clock time $t_{18}$ on.

The JK flip-flops 428 and 426 are readily available off the shelf as a conventional dual integrated circuit, i.e. a single chip containing both the JK flip-flops 426 and 428 within a single package. Even more preferable, however, is the design of the entire circuit of FIG. 4 in integrated form on a single chip mounted in a single package. This is possible because of the small size of the integrating feedback capacitor 436, which does not have to charge up over a very long pulse-gating interval as in prior circuits but need only charge long enough to achieve a feedback-forced zero crossing followed by the next clock input to the JK flip-flop 428. If a typical clock frequency of 10 KHz is employed, the clocking of the flip-flop 428 occurs at a 5 KHz rate, which holds the capacitor 436 down to a size easily permitting its manufacture in integrated circuit form.

Analog Computations.

The circuit of this invention has an additional very valuable capability, missing for all practical purposes from other analog-to-digital converter circuits, of performing various analog computations when provided with appropriate inputs. In FIG. 4, for example, if, instead of the reference voltage available from the potentiometer 444, an analog signal is applied to the feedback input lead 426 by means of an alternative input terminal 450, then the output of the circuit of FIG. 4 will represent a quantity equal to the analog input quantity on lead 402 divided by the analog input quantity on terminal 450. As those skilled in the analog computation art will readily understand, the source output current of the FET switch 424 is the product of the switch "on" time times the amplitude of the FET drain output . Since the gate input is the output pulse train of the circuit, its cumulative pulse duration, and therefore the "on" time of the FET switch, represents the average value of the analog signal input to terminal lead 402. Therefore the FET source output represents a multiplication of the quantity represented by the signal on lead 402 times the quantity represented by the amplitude of the signal applied to terminal 450. However, it is a mathematically demonstrable characteristic of analog computation circuits that a multiplication which is performed in a negative feedback loop, such as that represented by the lead 422, FET 424 and lead 404, has the effect of a division. Thus if the reference voltage normally applied to lead 426 is replaced by an analog signal the amplitude of which represents a variable, then the output of the circuit of FIG. 4 will represent the input to terminal 402 divided by the input to terminal 450.

The circuit of FIG. 4 can also be used as a multiplier, based upon the same multiplying characteristic of an FET switch. In order to accomplish this, the input to terminal 402 is replaced by an input to the summing junction 400 which comes from the source output of an FET switch 452. The gate input to this FET switch must be an optimized stream of pulses of the type produced by the present circuit, in which the average amplitude of the pulse train represents an input quantity in an analog manner. The source output from the FET switch 452 then equals the product of the gate "on" time and the amplitude of the drain input current arriving over current summing resistor 454. Thus the source output current arriving at the summing junction 400 is inherently a product, and the overall circuit output on lead 420 represents that product.

Lung Function Analyzer

The multiplying and dividing capabilities of this circuit are especially helpful when it is employed in a lung function analyzer of the type illustrated in FIG. 6. Also helpful in this environment is the fact that the pulse train output of such a circuit can be digitally delayed by the use of a modest length shift register. The lung function analyzer of FIG. 6 is a device which measures the flow rate of air expired by a patient, and the concentration of nitrogen in the same expired air sample, and then uses this information to display the nitrogen concentration quantity and to compute and display two medically important quantities known as nitrogen wash-out and maximum expiratory flow rate. The nitrogen wash-out is the product of nitrogen concentration times total expiratory air volume. Its computation involves a difficulty, in that measurement of the nitrogen concentration causes a forty millisecond delay which must be compensated by an equal delay of the total expired air volume factor to restore synchronization, otherwise the calculation will not be accurate. Maximum expiratory flow rate (MEFR) is a figure indicating how fast a patient can empty a standard volume (1,000 cubic centimeters) of air from his lungs, and is calculated by taking the reciprocal of a measured time interval required for that volume to be forcibly expired from the patient's lungs.

In the circuit of FIG. 6 a sample of expired air is passed through a conventional nitrogen concentration measuring device, which has the characteristic of introducing a forty millisecond delay between the expiration of the air sample and the appearance of a signal on an input lead 600 which represents in an analog manner the value of the nitrogen concentration measured. This signal is processed by a linearizing ladder network 602, which may be of conventional design, and which delivers at its output a linearized version of the nitrogen concentration signal originally received over lead 600. The linearized output signal on lead 604 is then applied to an optimizing analog-to-digital converter 606 of the type illustrated in greater detail in FIG. 4. The converter 606 receives over lead 610 a clock input corresponding to the input on lead 445 of FIG. 4. The clock is derived from a time base circuit 608.

The pulse train output of the circuit 606 is applied over a lead 611 to a gate 612 which is held open for an interval measured by a timing signal from circuit 608 applied over a lead 614. That portion of the pulse stream on lead 611 which is allowed to pass through gate 612 is delivered over lead 616 to a conventional pulse counter circuit 618 which counts the total number of pulses passing the gate during the open interval. After the counter has accumulated all the pulses passed by the gate 612, a timing signal is applied over a lead 620 to a read-out device 622 which then receives the total count from counter 618 over a cable 624 and displays the nitrogen concentration. This display is forty milliseconds late, but that is of no particular concern so far as the nitrogen concentration read out is concerned. At the end of the read out interval, signals from timer circuit 608 are delivered over leads 620 and 626 respectively to clear the display device 622 and reset the counter 618, after which the gate 612 is again opened to begin another cycle of nitrogen concentration display.

Expired air flow rate is measured by a conventional flow rate sensor, and the analog output of the sensor is applied over a lead 630 as the signal input to another optimizing analog-to-digital converter circuit 632 which receives the required clocking input from the timer circuit 608 over a lead 634. The pulse train output of the converter circuit 632 is applied over a lead 636 to the input of a digital delay line in the form of a shift register 638. The shift register is strobed to advance the stored pulse train by a clock-over-two input on a lead 640, which is readily derived from the frequency-dividing JK flip-flop stage of the converter circuit i.e. i.e. the output on lead 418 of FIG. 4. The effect of the shift register 638 is to delay the pulse signal representing the expired air flow rate by forty milliseconds, so as to synchronize it with the corresponding time section of the nitrogen concentration signal, which is unavoidably delayed by an equal length of time.

Upon emerging from the shift register 638, the delayed optimized pulse train is applied over a lead 642 to the gate input of an FET switch 644, while the drain input to the FET switch comes from a resistor 646 and a lead 648 issuing from the output of linearizer 602. As a result, the delayed optimized pulse representation of expired air flow rate appearing on lead 642 is multiplied in an area sense by the delayed linearized nitrogen concentration signal appearing on lead 648. This product is represented by the source output current of the FET switch 644, and is applied over a lead 650 to the summing junction of still another optimizing analog-to-digital converter circuit 652.

The product thus computed, expired air flow rate times nitrogen concentration properly synchronized therewith, equals the true total nitrogen wash-out from the lungs of the patient, and is displayed by a read-out device 654 operating in response to a pulse counter 656 and gate 658. The counter and gate are programmed by the timer circuit 608 in the same manner as the counter 618 and gate 612.

In order to calculate maximum expiratory flow rate, it is necessary to calculate the reciprocal of the time interval required for the patient to expire the standard volume of air. This is done by passing the delayed pulse train output from the shift register 638 through a coincidence gate 670 which is strobed at the half clock rate by the pulse stream available on lead 640. The purpose of the clocked gate 670 is to restore clock synchronization, i.e. a return-to-zero wave shape, to the pulse stream issuing from the shift register 638, since the output of the latter circuit has a non-return-to-zero wave shape. A re-clocked pulse stream issues from the coincidence gate 670 over a lead 672 and is applied to a conventional analog integrator circuit 674 which integrates the signal on lead 672 (instantaneous value of expired air flow rate) to produce an integral output on lead 676 which represents the total air volume expired during the integration interval.

The maximum expiratory flow rate test is normally not started at the beginning of the patient's expiration, but is conducted in the 1,000 cubic centimeter interval starting after the first two hundred cubic centimeters have been expired and concluding when twelve hundred cubic centimeters have been expired. Accordingly, a threshold detector circuit 678 is set to detect a threshold level of the integrator output signal corresponding to two hundred cubic centimeters of expired air, and another threshold level corresponding to twelve hundred cubic centimeters of expired air. The two hundred cubic centimeter threshold detection event causes a signal to be issued over a lead 680 which opens a gate 682 to the passage of a clock pulse stream provided by the timer circuit 608 over a lead 684. Subsequently, when the twelve hundred cubic centimeter threshold is reached, the circuit 678 issues another output over a lead 686 which closes the gate 682, stopping the passage of clock pulses therethrough.

During the gate-open interval a stream of clock pulses passes through gate 682 and is applied over a lead 688 to a conventional pulse counter 690. As a result, the cumulative pulse count run up on the counter 690 during the gate-open interval represents the total gate-open time, which is equal to the time the patient requires to force one thousand cubic centimeters of air from his lungs. This digital time representation is applied over a lead 692 to a conventional digital-to-analog converter 694 which generates an analog signal representing the expiratory time interval and applies it over a lead 696 to a conventional operational amplifier circuit 698.

The analog time-representing output from the amplifier 698 is applied over a lead 700 to the dividing input terminal of still another optimizing circuit 702 of the type described above. In other words, the analog signal on lead 700 is applied to an input terminal of circuit 702 which corresponds to terminal 450 of FIG. 4, and is used instead of the output from potentiometer 444. At the same time, the signal applied to the input lead 704 of circuit 702, which corresponds to lead 402 of FIG. 4, is a constant reference voltage instead of an analog variable signal. If the reference input on lead 704 is scaled to an analog value of one, relative to the signal on lead 700, then the quantity calculated by the optimizing circuit 702 is: one divided by the signal on lead 700. In effect the circuit calculates the reciprocal of the air expiration time interval represented by the analog signal appearing on lead 700. The length of a time interval is a measure of how slowly a process is carried out, and conversely the reciprocal of that time interval is a measure of how fast the process is carried out. Accordingly, the reciprocal of the time necessary to expire a standard volume of air is a measure of how fast the air is expired, i.e. the maximum expiratory flow rate.

The optimizing converter circuit 702 takes its required clocking input signal from the timer 608 over a lead 706, and applies its pulse train output to a gate 708, pulse counter 710 and read out device 712. The read out device displays the maximum expiratory flow rate quantity in response to gate 708 and counter 710, which function in the same way and under the same type of timer-generated instructions as the counter 618 and gate 612.

Thus, the unique multiplying and dividing capabilities of the present circuit, as well as its capacity to drive a digital delay line in the form of a shift register, are put to good use in the context of a medical lung function analyzer. However, even when used as an ordinary analog-to-digital converter, the circuit of this invention is greatly superior to those of the prior art in the speed of its transient response, its resolution in the time domain, and its ability to be packaged in the form of an integrated circuit within a single package.

Since the foregoing description and drawings are merely illustrative, the scope of protection of the invention has been more broadly stated in the following claims; and these should be liberally interpreted so to obtain the benefit of all equivalents to which the invention is fairly entitled.

What I claim is:

1. An analog-to-digital converter of the type having an analog signal integrator, a threshold detector responsive to the crossing of a selected threshold level by said integrator output, a clock, switching means responsive to the outputs of said threshold detector and said clock, and means for applying a feedback input to said integrator for opposing and overcoming an analog signal input to said integrator, said switching means being arranged to turn said feedback input on and off so that said integrator output is a ramp sloping in alternate directions during alternate time periods; wherein:

said switching means comprises at least one logic level input and one clocked input, and is arranged to switch said feedback input whenever a net change of logic level at said one input is followed by receipt of a clocking signal at said other input, but does not switch said feedback input if no net change in logic level occurs at said one input between the receipt of two consecutive clocking signals at said other input;

said clocking input of said switching means is operatively connected to said threshold detector output;

whereby said switching means switches said feedback input upon the occurrence of the next clock-generated input thereto following a net crossing of said threshold level by said integrator output ramp, said switching means always being fully synchronous with said clocking signal.

2. The device of claim 1 wherein said switching means comprises:
a feedback control switch;
a gate having a pair of inputs, said gate being connected to open and close said feedback control switch;
a flip-flop having an output connected to control one of said gate inputs;
frequency dividing means connected to receive said clock output and divide it to a lower repetition rate, and to segregate alternate intervals of the higher repetition rate clock output;
the lower repetition rate output of said frequency divider means being connected to control said trigger input;
the other one of said gate inputs being energized by said frequency dividing means during alternate clock intervals;
said gate opening said feedback control switch only upon coincidence of one of said flip-flop states with alternate clock intervals.
3. The device of claim 2, further comprising:
means for adjusting the level of said feedback input.
4. The device of claim 2 wherein:
said frequency dividing and interval segregating means is a second flip-flop, and the frequency division ratio thereof equals two.
5. The device of claim 4 wherein:
said two flip-flops are both incorporated within a single integrated circuit confined to a single package.
6. The device of claim 4 wherein:
said two flip-flops are JK circuits.
7. The device of claim 1 wherein:
said threshold detector is an operational amplifier which is driven to positive or negative saturation, depending upon the instantaneous polarity of said integrator output relative to said selected threshold level.
8. The device of claim 1 wherein:
said integrator comprises an operational amplifier and a capacitor connected thereacross to provide negative feedback;
said operational amplifier and said feedback capacitor are both incorporated within a single integrated circuit confined to a single package.
9. The device of claim 1 further comprising:
input means for applying an additional variable analog signal to said feedback applying means instead of a feedback input, whereby the average value of the net input to said integrator represents the average value of said first-mentioned analog signal divided by the average value of said additional variable signal at said additional input means.
10. The device of claim 1 further comprising:
dual input means to said integrator including an analog switch having a pair of input electrodes and an output electrode connected to the input of said integrator and arranged so that the average value of the net signal input to said integrator represents the product of the average values of said inputs to said analog switch.
11. An analog-to-digital converter which optimizes its output relative to a quantized time domain comprising discrete equal time intervals; comprising:
integrator means for computing the integral of an analog signal;
time-partitioning means;
means for progressively overcoming the effect of said analog signal input on said integrator;
means responsive to said integral computing means for determining whether the integral of said analog signal is above or below a selected level;
and switching means responsive to said determining means and said time-partitioning means, and arranged to allow said overcoming means to overcome the effect of said analog signal on said integrator to a predetermined extent during at least a portion of time intervals when said integral is above said selected level upon the occurrence of a time-partitioning event, and to reduce the effectiveness of said overcoming means in overcoming the effect of said analog signal on said integrator below said predetermined extent at least during those time intervals when said integral is below said selected level upon the occurrence of a time-partitioning event, whereby said switching means is always fully synchronous with said time-partitioning event.
12. A device as in claim 11 wherein said switching means comprises:
means responsive to said time-partitioning means for generating one or another of the values of a plural-valued quantity following time-partitioning events and responsive to said determining means to generate one of said values when said integral is above said selected level and another of said values when said integral is below said selected level;
and disabling means responsive to said plural-valued quantity generator to disable said overcoming means when one of said values of said plural valued quantity is generated.
13. A device as in claim 12 wherein:
said time-partitioning means includes a times base, and a dividing means for partitioning time at a rate which is a sub-multiple of the repetition rate of said time base;
said plural-valued quantity generator makes its value decisions at said sub-multiple rate time-partitioning events;
said analog-to-digital converter device further comprises means for detecting coincidence between said first state of said plural-valued quantity generator and alternate intervals of time as partitioned by said higher rate time base;
and said disabling means is arranged to make said overcoming means effecting during intervals when said coincidence is detected, and to disable said overcoming means during all other intervals.
14. A circuit comprising:
an analog-to-digital converter of the type producing a pulse train output which is optimized relative to a quantized time domain and the average value of which is an analog representation of the input signal to said converter;
means for applying to said analog-to-digital converter an input signal which is an analog representation of the flow rate of a sample of expired air;
a first analog integrator for integrating the output of said converter;
means for detecting when the output of said first analog integrator reaches a selected stop threshold level;
a digital time base generator;
a digital counter;
means including a gate connecting the output of said time base generator to the input of said digital counter;
means for first opening said gate to the passage of said time base generator output, and subsequently closing said gate when the output of said first analog integrator reaches said selected stop threshold level;
means including a digital-to-analog converter receiving the output of said counter and converting the cumulative count thereof to an analog signal representing the open time of said gate;
and a reciprocating circuit including a second analog integrator, a constant reference level applied to the input of said second analog signal integrator, said constant reference level being opposite in polarity to, and exceeding the amplitude of, said time-representing analog signal, a threshold detector responsive to the crossing of a selected threshold level by said second analog integrator output, means for receiving a clocking signal, switching means of the type which has at least one logic level input and one clocked input and which changes its state whenever a net change of logic level at said one input is followed by a clocking signal at said other input but does not change its state if no net change in logic level occurs at said one input between the receipt of two consecutive clocking signals at said other input, said clocked input being connected at least indirectly to said clocking signal means, said logic level input being connected at least indirectly to said threshold detector output, said switching means being arranged for turning on and off a feedback input to said second analog integrator depending upon the sate of said switching means;

said time-representing analog signal output being connected to said switching means for use as said feedback input to said second analog integrator whereby said circuit computes the reciprocal of said gate-open time;

and means for displaying the output of said reciprocating circuit as a maximum expiratory flow rate quantity.

15. A device as in claim 14 wherein said gate opening means comprises;

means for detecting when the output of said first analog integrator reaches a selected start threshold level;

and means for opening said gate upon the attainment of said start threshold level.

16. An analog-to-digital data conversion method comprising the steps of a. providing an analog data signal having a variable characteristic as an input to a feedback loop, b. providing a digital pulse train sequence within said feedback loop in response to said variable analog signal, and c. optimizing said digital pulse train sequence by processing said variable analog data signal input and said digital pulse train signal within said feedback loop in accordance with the expression $$\frac{\left[\int_0^{tn}(x-a)\,dt+\int_{tn}^{tn+1}(x-a_n)\,dt\right]}{\int_0^{tn}(x-\hat{a})\,dt+\int_{tn}^{tn+1}(x-a_n)\,dt}$$

where $n$ is a variable integer, $a$ represents a sequence which is a function of said pulse train sequence having a maximum value $a_{max}$ and a minimum value $a_{min}$, where $\hat{a}=\{a_0, a_1, a_2, \ldots a_1, \ldots a_{n-1}\}$ $x(t)$ represents said variable analog signal, $t_n$ represents an arbitrary clock time, and $a_n$ represents a value of said sequence which is a function of said pulse sequence at $t_n$, said $a_n$ value being $a_{max}$ when $$\int_0^{tn}(x-\hat{a})\,dt$$

is above a predetermined value and said $a_n$ value being $a_{min}$ when $$\int_0^{tn}(x-\hat{a})\,dt$$

is below said predetermined value, whereby said digital pulse train is optimized relative to a quantized time domain comprising discrete equal time intervals so as to provide a clocked optimal digital pulse train sequence representation of said variable analog signal as an output from said feedback loop.

17. In a measuring device in which at least a pair of variable analog signals are introduced in order to determine a measured quantity, wherein a system delay relative to said other analog signal is introduced in one of said analog signals during production of said one analog signal, the improvement comprising an analog to digital conversion means having a feedback loop system in which a digital pulse train sequence representation of said other variable analog signal is produced, said feedback system including means for optimizing said pulse train sequence by processing said sequence in accordance with the expression $$\int_0^{tn}(x-\hat{a})\,dt+\int_{tn}^{tn+1}(x-a_n)\,dt$$

where n is a variable integer, $a$ represents a sequence which is a function of said pulse train sequence having a maximum value $a_{max}$ and a minimum value $a_{min}$, where $\hat{a}=\{a_0, a_1, a_2, \ldots a_i, \ldots a_{n-1}\}$, $x(t)$ represents said other variable analog signal, $t_n$ represents an arbitrary clock time, and $a_n$ represents a value of said sequence which is a function of said pulse sequence at $t_n$, said $a_n$ value being $a_{max}$ when $$\int_0^{tn}(x-\hat{a})\,dt$$

is above a predetermined value and said $a_n$ value being $a_{min}$ when $$\int_0^{tn}(x-\hat{a})\,dt$$

is below said predetermined value, so as to provide an optimal pulse train sequence representation of said other variable analog signal as an output of said conversion means; and a digital delay line for introducing a time delay in said optimized pulse train output which is substantially equivalent to said system delay, said digital delay line including a clocked shift register operatively connected to said conversion means to receive and repeatedly shift said optimized pulse train output, whereby said analog signals are effectively synchronized during said determination

18. A device as in claim 17 for use as a lung function analyzer, further comprising:

means for applying an input signal to said conversion means which is an analog representation of the volumetric flow rate of a moving sample of expired air, said input signal being said other analog signal;

means for analyzing the nitrogen concentration within said expired air sample, and generating a substantially linear analog representation of said concentration, said means introducing a time delay into the production of said analog representation which is substantially equal to the delay time of said digital delay line, said analog representation of said concentration being said one analog signal, said analyzing means introduced time delay being said system delay;

a second pulse-train-producing circuit, the output of which represents a quantity in an optimal manner relative to a quantized time domain;

means for multiplying the output of said delay line and the output of said linear nitrogen concentration signal generator, and applying the product thereof to the input of said second pulse-train-producing circuit, whereby the output pulse train thereof represents the product of said inputs;

and means for reading out said product as the total nitrogen wash-out in said sample of expired air.

19. A device as in claim 17, further comprising:

a clocked coincidence gate connected to receive the output of said shift register; and means operatively connected to said shift register and to said coincidence gate to provide a clock signal thereto, whereby said coincidence gate restores clock synchronization to said pulse train output of said shift register.

* * * * *